United States Patent
Bai et al.

(10) Patent No.: US 9,236,115 B2
(45) Date of Patent: Jan. 12, 2016

(54) CIRCUIT FOR ENHANCING ROBUSTNESS OF SUB-THRESHOLD SRAM MEMORY CELL

(71) Applicant: SOUTHEAST UNIVERSITY, Jiangsu (CN)

(72) Inventors: Na Bai, Jiangsu (CN); Longxing Shi, Jiangsu (CN); Jun Yang, Jiangsu (CN); Xinning Liu, Jiangsu (CN); Jiafeng Zhu, Jiangsu (CN); Yue Feng, Jiangsu (CN); Cai Gong, Jiangsu (CN); Fei Pan, Jiangsu (CN); Hong Chang, Jiangsu (CN); Yifeng Deng, Jiangsu (CN); Yuan Chen, Jiangsu (CN); Yingcheng Xia, Jiangsu (CN)

(73) Assignee: Southeast University (CN)

( * ) Notice: Subject to any disclaimer, the term of this patent is extended or adjusted under 35 U.S.C. 154(b) by 0 days.

(21) Appl. No.: 14/369,651

(22) PCT Filed: Dec. 27, 2012

(86) PCT No.: PCT/CN2012/087719
§ 371 (c)(1),
(2) Date: Jun. 27, 2014

(87) PCT Pub. No.: WO2013/097749
PCT Pub. Date: Jul. 4, 2013

(65) Prior Publication Data
US 2014/0376305 A1 Dec. 25, 2014

(30) Foreign Application Priority Data
Dec. 28, 2011 (CN) .......................... 2011 1 0445966

(51) Int. Cl.
*G11C 11/419* (2006.01)
*G11C 11/417* (2006.01)
*H01L 27/11* (2006.01)
*G11C 11/412* (2006.01)

(52) U.S. Cl.
CPC ............ *G11C 11/419* (2013.01); *G11C 11/412* (2013.01); *G11C 11/417* (2013.01); *H01L 27/1104* (2013.01)

(58) Field of Classification Search
CPC ............... G11C 29/50; G11C 29/5004; G11C 11/41–11/419; H01L 27/1104
See application file for complete search history.

(56) References Cited

U.S. PATENT DOCUMENTS

| 7,924,640 | B2 * | 4/2011 | Deng et al. | 365/201 |
| 8,085,579 | B2 * | 12/2011 | Inoue | 365/154 |
| 8,582,378 | B1 * | 11/2013 | Chuang et al. | 365/201 |
| 2009/0161410 | A1 | 6/2009 | Houston | 365/154 |

FOREIGN PATENT DOCUMENTS

| CN | 101625891 | 1/2010 | G11C 11/40 |
| CN | 101635168 | 1/2010 | G11C 11/40 |
| CN | 102522115 | 6/2012 | G11C 11/413 |

OTHER PUBLICATIONS

International Search Report issued in corresponding PCT Patent Appln. Serial No. PCT/CN2012/087719 dated Mar. 11, 2013, with English translation (4 pgs).

* cited by examiner

*Primary Examiner* — Harry W Byrne
*Assistant Examiner* — Lance Reidlinger
(74) *Attorney, Agent, or Firm* — Hayes Soloway P.C.

(57) ABSTRACT

A circuit for improving process robustness of sub-threshold SRAM memory cells serves as an auxiliary circuit for a sub-threshold SRAM memory cell. The output of the circuit is connected to PMOS transistors of the sub-threshold SRAM memory cell and substrate of PMOS transistors in the circuit. The circuit includes a detection circuit for threshold voltages of the PMOS transistors and a differential input and single-ended output amplifier. The circuit changes the substrate voltage of the PMOS transistors in the sub-threshold SRAM memory cell and the PMOS transistors in the circuit in a self-adapting manner by detecting threshold voltage fluctuations of PMOS and NMOS transistor resulted from process fluctuations and thereby regulates the threshold voltages of the PMOS transistors, so that the threshold voltages of the PMOS and NMOS transistors match. The circuit improves the noise margin of sub-threshold SRAM memory cells and the process robustness of sub-threshold SRAM memory cells.

1 Claim, 5 Drawing Sheets

CIRCUIT FOR ENHANCING ROBUSTNESS OF SUB-THRESHOLD SRAM MEMORY CELL

FIELD OF THE INVENTION

The present invention relates to a circuit for improving process robustness of sub-threshold SRAM (Static Random Access Memory) memory cells, and belongs to the technical field of integrated circuit design.

BACKGROUND OF THE INVENTION

Sub-threshold design has been widely applied owing to its ultra-low energy consumption characteristic. However, as the system supply voltage enters into the sub-threshold region, the impact of process fluctuations on the threshold voltage of MOS transistors in memory cells becomes more severe. For SRAM memory circuits, process fluctuations may result in degraded performance and even faults of the memory cells. That phenomenon brings a new challenge to stability design of the entire system. Therefore, it is necessary to employ process fluctuation compensation measures to improve stability of SRAM memory cells.

In the sub-threshold region, the threshold voltage of MOS transistor is in an exponential relationship with the driving power; therefore, the driving power of MOS transistor can be changed effectively by changing the threshold voltage of sub-threshold MOS transistor. Changing the substrate voltage of MOS transistor is one of the most effective measures for changing the threshold voltage of MOS transistor. However, owing to the fact that the substrate voltage of NMOS transistor manufactured in a single well process is the power ground, changing the substrate voltage of PMOS transistor is an effective approach to implement that method.

SUMMARY OF THE INVENTION

Object of the invention: the object of the present invention is to provide a circuit for improving process robustness of sub-threshold SRAM memory cells, in order to solve the problem that the threshold voltage of MOS transistors in the sub-threshold region is affected by process fluctuations and may result in degraded performance and even failures of SRAM memory cells. By detecting threshold voltage fluctuations of the PMOS transistors and NMOS transistors resulted from process fluctuations, the circuit changes the substrate voltage of the PMOS transistors in a sub-threshold memory cell and thereby regulates the threshold voltage thereof, so that the threshold voltage of the PMOS transistors in the sub-threshold memory cell matches the threshold voltage of the NMOS transistors; in that way, the noise margin of the memory cell is increased and the process robustness of the sub-threshold SRAM memory cell is effectively improved.

Technical solution: a circuit for improving process robustness of sub-threshold SRAM memory cells, which serves as an auxiliary circuit of a sub-threshold SRAM memory cell, with the output ($V_{bp}$) of the circuit being connected to the substrates of PMOS transistors in the sub-threshold SRAM memory cell; the circuit comprises a detection circuit for threshold voltage of PMOS transistor and a differential input and single-ended output amplifier, wherein:

The detection circuit for threshold voltage of PMOS transistor comprises a PMOS transistor P1 and a NMOS transistor N1, the source terminal of the PMOS transistor P1 is connected to the supply voltage VDD, the drain terminal and gate terminal of the PMOS transistor P1 are connected with the drain terminal and gate terminal of the NMOS transistor N1 respectively, and the source terminal and substrate of the NMOS transistor N1 are connected together and then connected to the power ground VSS;

The differential input and single-ended output amplifier comprises a second PMOS transistor P2, a third PMOS transistor P3, a fourth PMOS transistor P4, a second NMOS transistor N2, a third NMOS transistor N3, a fourth NMOS transistor N4, and a fifth NMOS transistor N5; the drain terminal and gate terminal of the second PMOS transistor P2 are connected together and then connected with the gate terminal of the third PMOS transistor P3 and the drain terminal of the second NMOS transistor N2, the source terminal of the second PMOS transistor P2 is connected with the source terminal of the third PMOS transistor P3 and then connected to the supply voltage VDD, the gate terminal of the second NMOS transistor N2 is connected with the gate terminal of the fourth NMOS transistor N4 and then connected to an external bias voltage ($V_{bias}$), the source terminal of the second NMOS transistor N2 is connected with the source terminal of the third NMOS transistor N3 and the drain terminal of the fourth NMOS transistor N4, and the source terminal of the fourth NMOS transistor N4 is connected to the power ground VSS; the gate terminal of the third NMOS transistor N3 is connected with the drain terminal and gate terminal of the first NMOS transistor N1 in the detection circuit for threshold voltage of PMOS transistor, the drain terminal of the third NMOS transistor N3 is connected with the drain terminal of the third PMOS transistor P3, the gate terminal of the fourth PMOS transistor P4 and the gate terminal of the fifth NMOS transistor N5, the source terminal of the fourth PMOS transistor P4 is connected to the supply voltage VDD, and the source terminal of the fifth NMOS transistor N5 is connected to the power ground VSS;

The substrates of the second NMOS transistor N2, third NMOS transistor N3, fourth NMOS transistor N4, and fifth NMOS transistor N5 are connected to the power ground VSS, the drain terminal of the fourth PMOS transistor P4 is connected with the drain terminal of the fifth NMOS transistor N5 and connected with the substrates of the first PMOS transistor P1, the second PMOS transistor P2, the third PMOS transistor P3, and the fourth PMOS transistor P4 to serve as the output terminal ($V_{bp}$) of the auxiliary circuit.

Beneficial effects: compared with the prior art, the circuit for improving process robustness of sub-threshold SRAM memory cells in the present invention can be applied in a super-wide supply voltage range in the sub-threshold region in single-well process, and it can change the threshold voltage of the PMOS transistors by changing the substrate voltage of the PMOS transistors in a sub-threshold SRAM memory cell to make the threshold voltage of the PMOS transistors match the threshold voltage of the NMOS transistors in different processes, and thereby improve the noise margin of the sub-threshold SRAM memory cell and effectively improve the process robustness of the sub-threshold SRAM memory cell. The circuit can operate in a super-wide supply voltage range (0.2V~0.7V) in the sub-threshold region.

EMBODIMENTS

Hereunder the present invention will be further detailed in embodiments, with reference to the accompanying drawings. It should be understood that these embodiments are provided only for describing the present invention, and are not intended for limiting the scope of the present invention. Upon reading the present invention, those skilled in the art can make various equivalent modifications to the present invention without departing from the protection scope defined in the attached claims of the present application.

Figure 1:
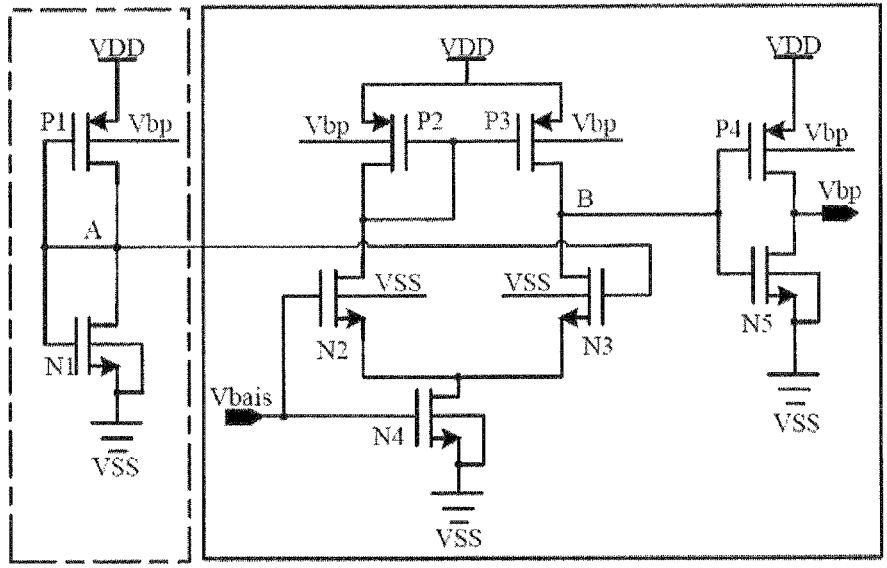
FIG. 1 is a structure diagram of the circuit provided in the present invention.

Please see FIG. 1. The circuit for improving process robustness of sub-threshold SRAM memory cells comprises a detection circuit for threshold voltage of PMOS transistor. In addition; it requires an external bias voltage ($V_{bias}$).

The detection circuit for threshold voltage of PMOS transistor comprises a first PMOS transistor P1 and a first NMOS transistor N1; the source terminal of the first PMOS transistor P1 is connected to the supply voltage VDD, and the drain terminal and gate terminal of the first PMOS transistor P1 are connected with the drain terminal and gate terminal of the first NMOS transistor N1 respectively; the source terminal and substrate of the first NMOS transistor N1 are connected together and then connected to the power ground VSS;

The differential input and single-ended output amplifier comprises a second PMOS transistor P2, a third PMOS transistor P3, a fourth PMOS transistor P4, a second NMOS transistor N2, a third NMOS transistor N3, a fourth NMOS transistor N4, and a fifth NMOS transistor N5; the drain terminal and gate terminal of the second PMOS transistor P2 are connected together and then connected with the gate terminal of the third PMOS transistor P3 and the drain terminal of the second NMOS transistor N2, the source terminal of the second PMOS transistor P2 is connected with the source terminal of the third PMOS transistor P3 and connected to the supply voltage VDD, the gate terminal of the second NMOS transistor N2 is connected with the gate terminal of the fourth NMOS transistor N4 and connected to an external bias voltage ($V_{bias}$), the source terminal of the second NMOS transistor N2 is connected with the source terminal of the third NMOS transistor N3 and the drain terminal of the fourth NMOS transistor N4, and the source terminal of the fourth NMOS transistor N4 is connected to the power ground VSS; the gate terminal of the third NMOS transistor N3 is connected with the drain terminal and gate terminal of the first NMOS transistor N1 in the detection circuit for threshold voltage of PMOS transistor, the drain terminal of the third NMOS transistor N3 is connected with the drain terminal of the third PMOS transistor P3, the gate terminal of the fourth PMOS transistor P4 and the gate terminal of the fifth NMOS transistor N5, the source terminal of the fourth PMOS transistor P4 is connected to the supply voltage VDD, and the source terminal of the fifth NMOS transistor N5 is connected to the power ground VSS;

The substrates of the second NMOS transistor N2, third NMOS transistor N3, fourth NMOS transistor N4, and fifth NMOS transistor N5 are connected to the power ground VSS, the drain terminal of the fourth PMOS transistor P4 is connected with the drain terminal of the fifth NMOS transistor N5 and connected with the substrates of the first PMOS transistor P1, the second PMOS transistor P2, the third PMOS transistor P3, and the fourth PMOS transistor P4 to serve as the output terminal ($V_{bp}$) of the auxiliary circuit.

Figure 2:
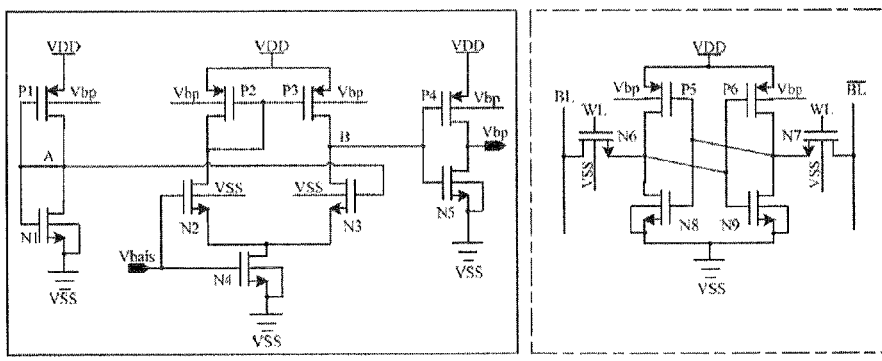
FIG. 2 is a structure diagram of the circuit in the present invention connected to a sub-threshold SRAM six-transistor memory cell.

Please see FIG. 2. In the circuit model, the output terminal of the circuit for improving process robustness of sub-threshold SRAM memory cells is connected with the substrates of a fifth PMOS transistor P5 and a sixth PMOS transistor P6 in a sub-threshold SRAM six-transistor memory cell, to verify that the present design can improve the process robustness of a sub-threshold SRAM memory cell.

The working principal of the circuit for improving process robustness of sub-threshold SRAM memory cells is as follows:

Detection circuit for threshold voltage of PMOS transistor

As shown in FIG. 1, a first PMOS transistor P1 and a first NMOS transistor N1 constitute a detection circuit for threshold voltage of PMOS transistor. The driving current of sub-threshold MOS transistor ($I_{sub}$) is expressed as follows:

$$I_{sub} = \mu C_{ox}\left(\frac{W}{L}\right)(n-1)V_T^2 e^{\frac{V_{GS}-V_{th}}{nV_T}} \quad (1)$$

Wherein, $\mu$ is the mobility ratio of MOS transistor, W/L is the width-length ratio of MOS transistor, n is sub-threshold amplitude coefficient, $V_T$ is thermal voltage kT/q (approx. 26 mV at room temperature), and $V_{th}$ is the threshold voltage of MOS transistor.

The current in $N_1$ and $P_1$ is ($i_{D,N1}$, $i_{D,P1}$) respectively:

$$i_{D,N1} = \mu_n C_{ox}\left(\frac{W}{L}\right)_{N1}(n-1)V_T^2 e^{\frac{V_A-V_{thn}}{nV_T}} \quad (2)$$

$$i_{D,P1} = \mu_p C_{ox}\left(\frac{W}{L}\right)_{P1}(n-1)V_T^2 e^{\frac{VDD-V_A-V_{thp}}{nV_T}} \quad (3)$$

Wherein, $\mu_n$ and $\mu_p$ are the mobility ratios of NMOS and PMOS respectively, n is sub-threshold amplitude coefficient, $V_T$ is thermal voltage kT/q, VDD is supply voltage, $V_{thn}$ and $V_{thp}$ are threshold voltage (absolute value) of NMOS and PMOS respectively.

It can be seen from the diagram: $i_{D,N1}=i_{D,P1}$, and suppose $$\left(\frac{W}{L}\right)_{N1} = \left(\frac{W}{L}\right)_{P1},$$

then the level at point A ($V_A$) is:

$$V_A = \frac{1}{2}\left(VDD + V_{thn} - V_{thp} + nV_T\ln\frac{u_p}{u_n}\right) \quad (4)$$

It can be seen from the formula (4), $V_A$ is affected by the supply voltage VDD, $V_{thn}$, $V_{thp}$, $u_n$, and $u_p$. At a certain supply voltage, VDD is constant. The influence of $u_n$ and $u_p$ on $V_A$ is much lower than the influence of $V_{thn}$ and $V_{thp}$ in case of process fluctuations. Therefore, $$nV_T\ln\frac{u_p}{u_n}$$

is presumed as a fixed value here. Therefore, at a certain supply voltage, the level of $V_A$ is in a linear relationship with $V_{thn}$ and $V_{thp}$.

In summary, if $V_A$ is set to a fixed value at a certain supply voltage in the sub-threshold region, $V_{thn}$ and $V_{thp}$ will be maintained in a fixed linear relationship. By setting the width-length ratio of PMOS and NMOS, the driving power of NMOS can be balanced with the driving power of PMOS in case of process fluctuations.

Differential Input and Single-Ended Output Amplifier

Figure 3:
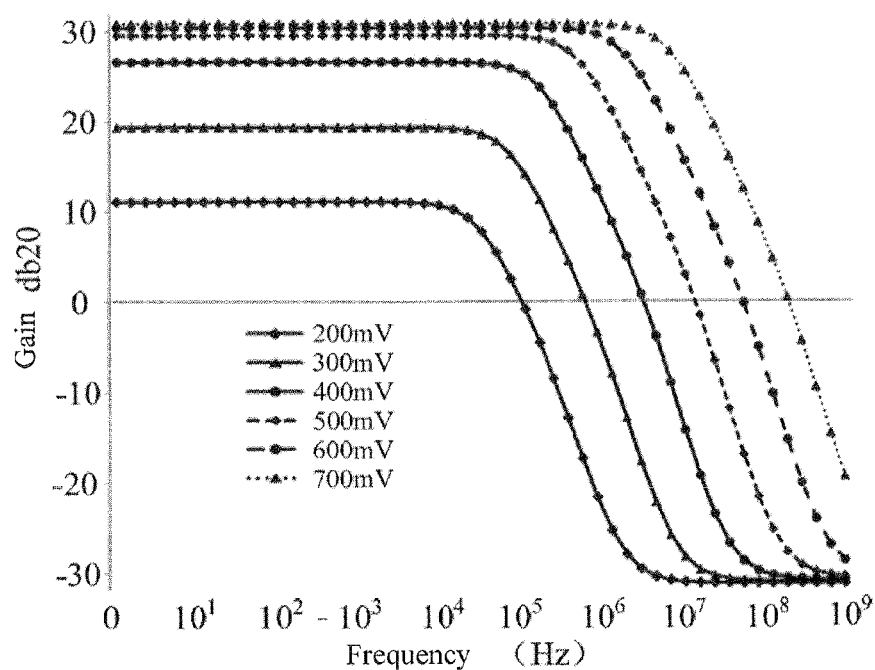
FIG. 3 is a gain diagram of the differential input and single-ended output amplifier used in the present invention.
Figure 4:
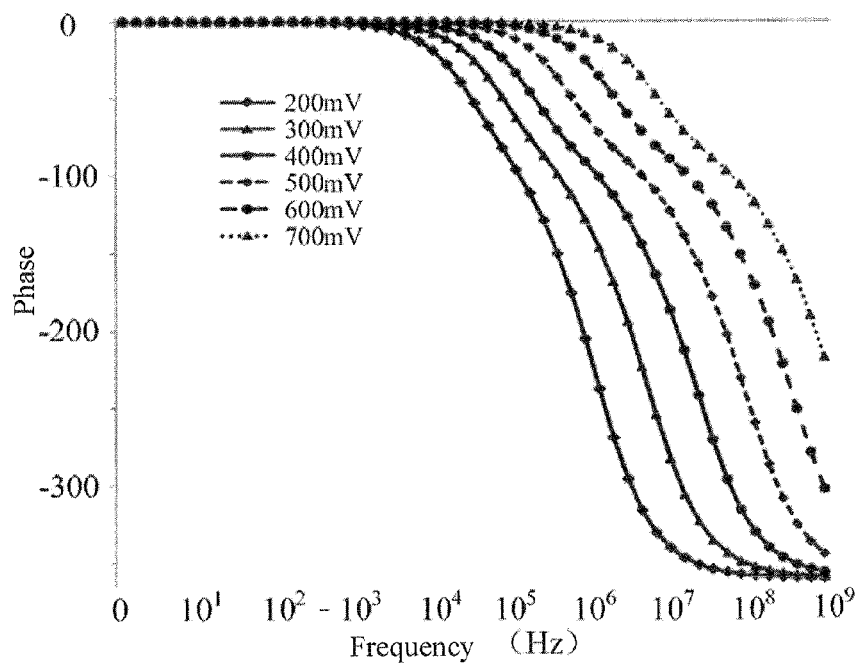
FIG. 4 is a phase diagram of the differential input and single-ended output amplifier used in the present invention.

In the present design, the used differential amplifier is a two-stage amplifier. The first stage is a differential input and single-ended output amplifier, and the second stage is mainly designed to increase driving power of the present design and control the output oscillation amplitude of the amplifier within the range of 0 to VDD. FIG. 3 and FIG. 4 show gain diagram and phase diagram of the sub-threshold amplifier at different supply voltages. It can be seen from the figures: at different supply voltages, the amplifier has a gain greater than 10 db and has enough phase margin)(>50°). Suppose the gain of the amplifier at different supply voltages is G, then:

$$V_{bp} = G(V_A - V_{bias}) \quad (5)$$

Wherein, $V_{bp}$ is the output voltage of the auxiliary circuit, G is the gain of the differential input and single-ended output amplifier, $V_A$ is the output of the detection circuit for threshold voltage of PMOS transistor, and $V_{bias}$ is an external bias voltage.

For the threshold voltage regulation process of PMOS transistor, $$V_{th} = V_{th0} + \gamma(\sqrt{|-2\phi_F + V_{SB}|} - \sqrt{|-2\phi_F|}) \quad (6)$$

Wherein, $V_{th}$ is the threshold voltage of MOS transistor, $V_{th0}$ is the threshold voltage when the substrate bias voltage is 0V, $V_{SB}$ is the bias voltage of source body, and $2\phi_F$ is surface potential.

In case of process fluctuations of MOS transistors, the threshold voltages of the MOS transistors P1 and N1 will fluctuate and therefore $V_A$ will vary; the differential input and single-ended output amplifier will amplify the difference between $V_{bias}$ and $V_A$, and change the substrate voltage of the PMOS transistor P1 with its output terminal, so that the threshold voltage of the PMOS transistor P1 will match the threshold voltage of the NMOS transistor N1. The gain of the amplifier is G. According to formula (5), as $V_A$ increases under the influence of process fluctuations, $V_{bp}$ will increase. According to formula (6), $V_{thp}$ will increase as the substrate voltage of PMOS increases. Finally, $V_A$ will decrease, till $V_A = V_{bias}$. Likewise, as $V_A$ decreases under the influence of process fluctuations, $V_{bp}$ will decrease, and therefore $V_{thp}$ will decrease; finally, $V_A$ will increase, till $V_A = V_{bias}$. Therefore, in different cases of process fluctuations, $V_A$ is equal to $V_{bias}$. Thus, the threshold voltage of NMOS is balanced with the threshold voltage of PMOS under process fluctuations.

In summary, the present design can regulate the substrate voltage of PMOS in a self-adapting manner according to process changes. Thus, the threshold voltage of NMOS is balanced with the threshold voltage of PMOS. The design can work in a super-wide supply voltage range in the sub-threshold region, by changing the bias voltage ($V_{bias}$).

Improve Process Robustness of Sub-Threshold SRAM Six-Transistor Memory Cells with the Design As shown in FIG. 3, the PMOS substrate of a sub-threshold SRAM six-transistor memory cell is connected to the output terminal ($V_{bp}$) of the amplifier. The process robustness of the sub-threshold SRAM six-transistor memory cell can be improved by setting $V_{bias}$ appropriately.

Figure 5:
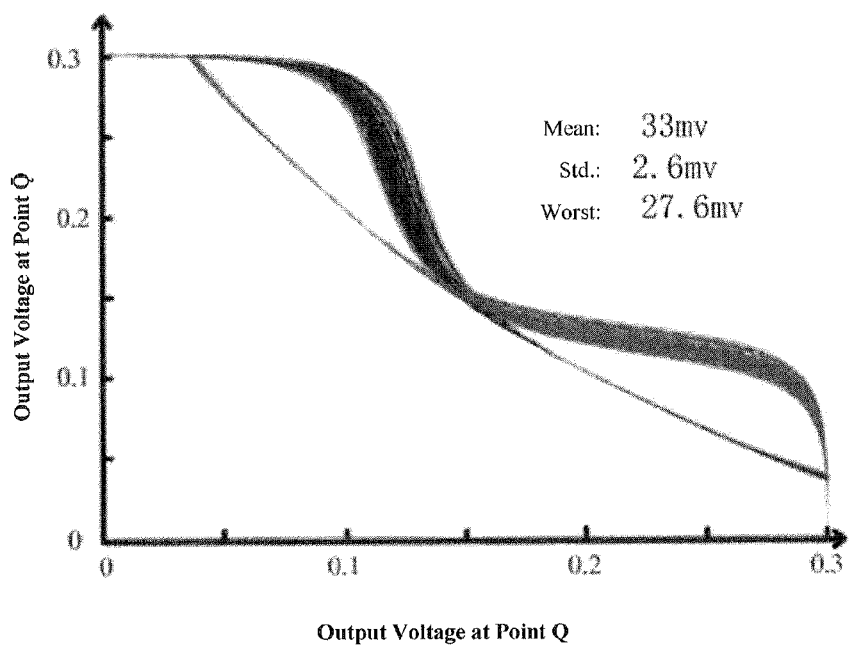
FIG. 5 shows the result of Monte Carlo analysis of reading noise margin for 500 times of a sub-threshold SRAM six-transistor memory cell at 300 mV supply voltage.
Figure 6:
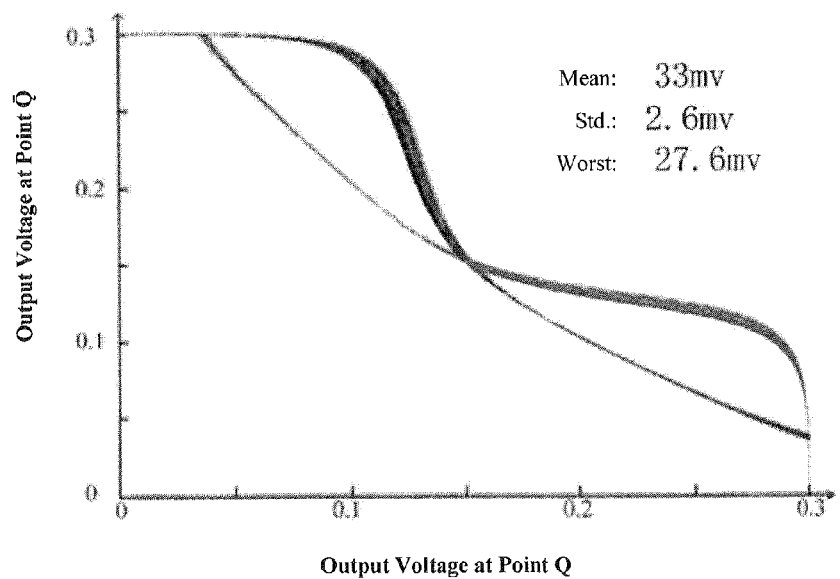
FIG. 6 shows the result of Monte Carlo analysis of reading noise margin for 500 times of a sub-threshold SRAM six-transistor memory cell that employs the design in the present invention at 300 mV supply voltage.

FIG. 5 shows the result of Monte Carlo analysis of reading noise margin for 500 times of a sub-threshold SRAM six-transistor memory cell at 300 mV supply voltage. FIG. 6 shows the result of Monte Carlo analysis of reading noise margin for 500 times of a sub-threshold SRAM six-transistor memory cell that employs the design in the present invention at 300 mV supply voltage. As can be seen from the comparison, the design can effectively improve the process robustness of sub-threshold memory cells.

In addition, the present design can improve robustness of SRAM memory cells in a super-wide working supply voltage range in the sub-threshold region. Only the value of $V_{bias}$ needs to be changed in order to meet the requirements of different supply voltages in the sub-threshold region. Table 1 shows the comparison of reading noise margin at different supply voltages between a sub-threshold SRAM six-transistor memory cell that employs the present design and a sub-threshold SRAM six-transistor memory cell that doesn't employs the present design.

TABLE 1

| Supply Voltage (mV) | Without Compensation Circuit | | | With Compensation Circuit | | | Performance Improvement | | |
|---|---|---|---|---|---|---|---|---|---|
| | Worst Case (mV) | Mean (mV) | Std (mV) | Worst Case (mV) | Mean (mV) | Std (mV) | Worst Case (mV) | Mean (mV) | Std (mV) |
| 200 | 8.2 | 13.4 | 2.3 | 14.3 | 16.8 | 0.7 | 74% | 25% | 70% |
| 300 | 27.6 | 33 | 2.6 | 37.4 | 38.8 | 0.48 | 36% | 18% | 82% |
| 400 | 46.4 | 52 | 2.8 | 59.1 | 59.9 | 0.49 | 27% | 15% | 83% |
| 500 | 63.2 | 70.2 | 3.4 | 78 | 80.2 | 1.1 | 23% | 14% | 68% |
| 600 | 78.4 | 87.4 | 4.6 | 93.4 | 98.6 | 2.3 | 19% | 13% | 50% |
| 700 | 89.6 | 102.3 | 6.4 | 103.5 | 112 | 4.1 | 16% | 9% | 36% |

As can be seen from Table 1, after the compensation circuit is added, the reading noise margin, mean and Std values of reading noise margin of the sub-threshold memory cell in the worst case at different supply voltages are improved significantly.

Table 2 shows the comparison of holding noise margin at different supply voltages between a sub-threshold SRAM six-transistor memory cell that employs the present design and a sub-threshold SRAM six-transistor memory cell that doesn't employs the present design.

TABLE 2

| Supply Voltage (mV) | Without Compensation Circuit | | | With Compensation Circuit | | | Performance Improvement | | |
|---|---|---|---|---|---|---|---|---|---|
| | Worst Case (mV) | Mean (mV) | Std (mV) | Worst Case (mV) | Mean (mV) | Std (mV) | Worst Case (mV) | Mean (mV) | Std (mV) |
| 200 | 7.5 | 56.4 | 5.1 | 13.7 | 57.9 | 3.5 | 82.7% | 2.7% | 31.4% |
| 300 | 53.8 | 103.3 | 5.1 | 63.5 | 104 | 3.6 | 18.0% | 0.7% | 29.4% |
| 400 | 100.5 | 150.2 | 5.2 | 113.9 | 152.6 | 3.1 | 13.3% | 1.6% | 40.4% |
| 500 | 146.7 | 196.6 | 5.1 | 161.8 | 199 | 3 | 10.3% | 1.2% | 41.2% |
| 600 | 191.5 | 241.7 | 5.1 | 205.4 | 243.7 | 3.2 | 7.3% | 0.8% | 37.3% |
| 700 | 236 | 284.2 | 5.4 | 246.8 | 285.4 | 4.3 | 4.6% | 0.4% | 20.4% |

Figure 7:
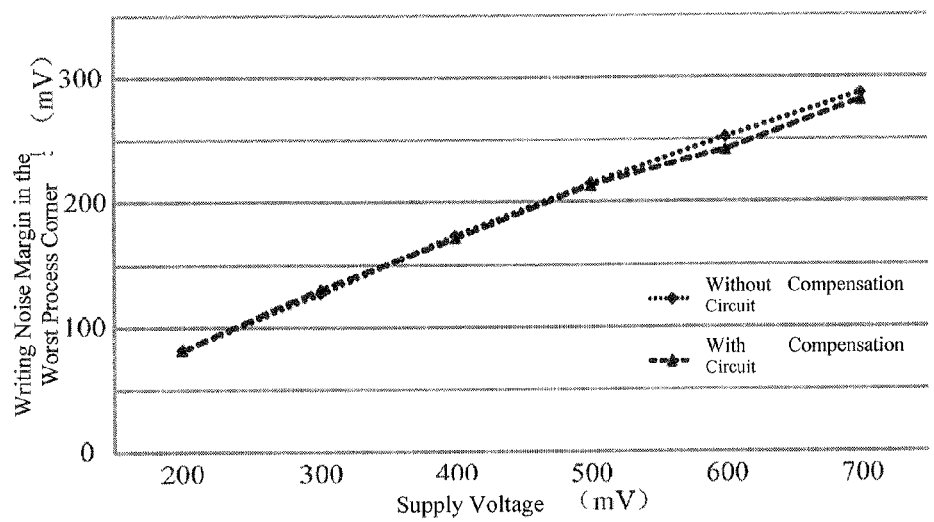
FIG. 7 shows the comparison of writing noise margin in the worst process corner in the sub-threshold region at different supply voltages between a sub-threshold SRAM six-transistor memory cell that employs the circuit in the present invention and a sub-threshold SRAM six-transistor memory cell that doesn't employs the circuit in the present invention.

FIG. 7 shows the comparison of writing noise margin between a SRAM six-transistor memory cell with the compensation circuit in the present invention and a conventional SRAM six-transistor memory cell in the worst process corner. As can be seen from the figure, the writing noise margin of the SRAM six-transistor memory cell with the compensation circuit is slightly degraded than the writing noise margin of a conventional SRAM six-transistor memory cell in the worst process corner.

Figure 8:
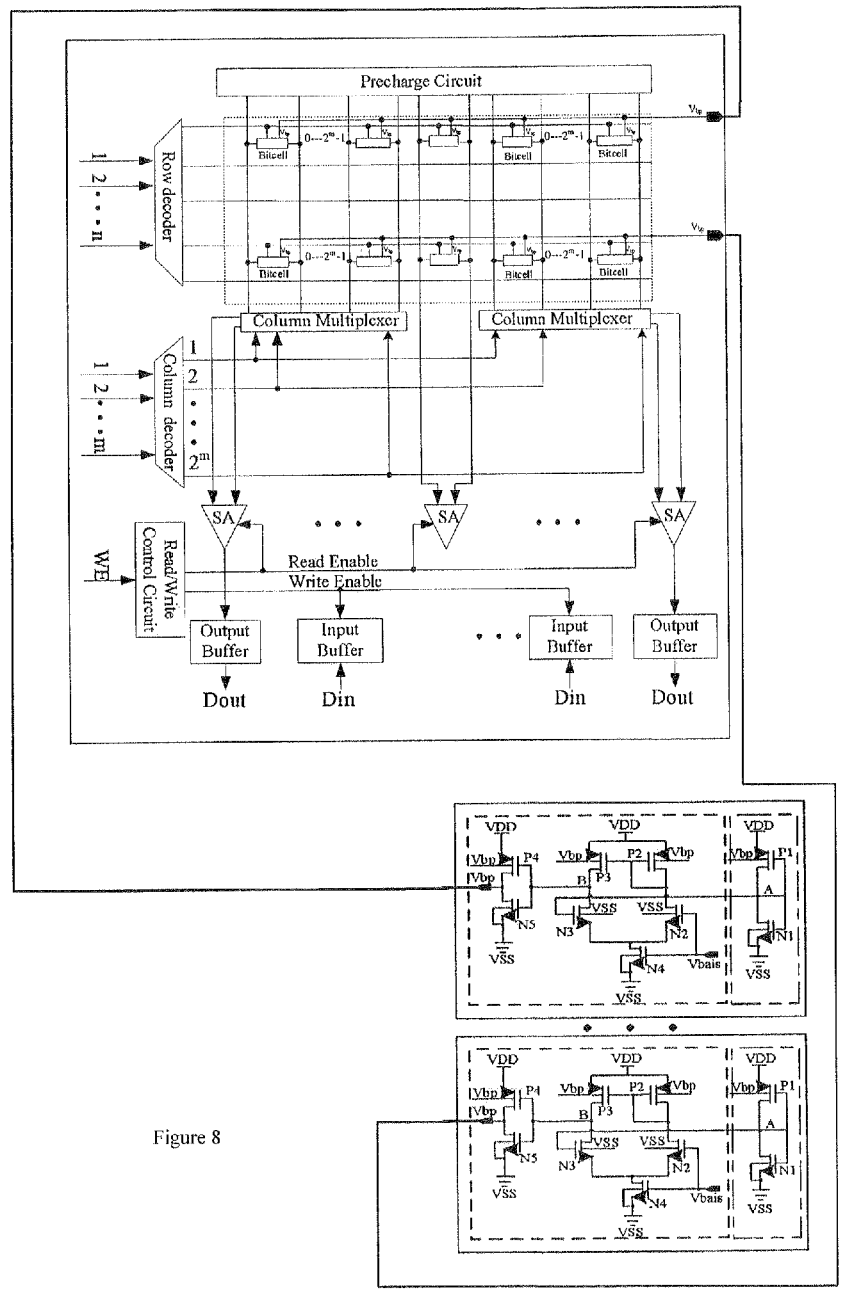
FIG. 8 shows an example of the present invention applied in sub-threshold SRAM.

It is worthy of noting that a plurality of bit cells can share the present design when the present design is applied in sub-threshold SRAM memory cells. FIG. 8 shows an application solution of the present design in sub-threshold SRAM memory cells.

In summary, with the present design, the reading noise margin and holding noise margin of a sub-threshold SRAM six-transistor memory cell are greatly improved than those of a conventional SRAM six-transistor memory cell at different supply voltages in the sub-threshold region, but the writing noise margin is slightly degraded.

The invention claimed is:

1. A circuit for improving process robustness of sub-threshold SRAM memory cells, wherein, the circuit serves as an auxiliary circuit for a sub-threshold SRAM memory cell, the output ($V_{bp}$) of the circuit is connected to a PMOS transistor of the sub-threshold SRAM memory cell and a substrate of the PMOS transistor in the circuit;
the circuit comprises a detection circuit for a threshold voltage of the PMOS transistor and a differential input and single-ended output amplifier, wherein:
the detection circuit for threshold voltage of the PMOS transistor comprises a first PMOS transistor (P1) and a first NMOS transistor (N1);
a source terminal of the first PMOS transistor (P1) is connected to the supply voltage VDD, and a drain terminal and a gate terminal of the first PMOS transistor (P1) are connected with a drain terminal and a gate terminal of the first NMOS transistor (N1);
a source terminal and a substrate of the first NMOS transistor (N1) are both connected to a power ground (VSS);
the differential input and single-ended output amplifier comprises a second PMOS transistor (P2), a third PMOS transistor (P3), a fourth PMOS transistor (P4), a second NMOS transistor (N2), a third NMOS transistor (N3), a fourth NMOS transistor (N4), and a fifth NMOS transistor (N5);
a drain terminal and a gate terminal of the second PMOS transistor (P2) are connected together and connected with a gate terminal of the third PMOS transistor (P3) and a drain terminal of the second NMOS transistor (N2), a source terminal of the second PMOS transistor (P2) is connected with a source terminal of the third PMOS transistor (P3) and connected to a supply voltage (VDD);
a gate terminal of the second NMOS transistor (N2) is connected with a gate terminal of the fourth NMOS transistor (N4) and connected to an external bias voltage ($V_{bias}$), a source terminal of the second NMOS transistor (N2) is connected with the source terminal of the third NMOS transistor (N3) and a drain terminal of the fourth NMOS transistor (N4), a source terminal of the fourth NMOS transistor (N4) is connected to the power ground (VSS), a gate terminal of the third NMOS transistor (N3) is connected with the drain terminal and the gate terminal of the first NMOS transistor (N1) in the detection circuit for the threshold voltage of the PMOS transistor, a drain terminal of the third NMOS transistor (N3) is connected with a drain terminal of the third PMOS transistor (P3), a gate terminal of the fourth PMOS transistor (P4), and a gate terminal of the fifth NMOS transistor (N5), a source terminal of the fourth PMOS transistor (P4) is connected to the supply voltage (VDD), and a source terminal of the fifth NMOS transistor (N5) is connected to the power ground (VSS);
substrates of the second NMOS transistor (N2), the third NMOS (N3), the fourth NMOS transistor (N4), and the fifth NMOS transistor (N5) are connected to the power ground (VSS), a drain terminal of the fourth PMOS transistor (P4) is connected with a drain terminal of the fifth NMOS transistor (N5) and connected with substrates of the first PMOS transistor (P1), the second PMOS transistor (P2), the third PMOS transistor (P3), and the fourth PMOS transistor (P4) to serve as the output terminal ($V_{bp}$) of the present auxiliary circuit.

* * * * *